United States Patent
Finocchiaro et al.

(10) Patent No.: US 11,959,995 B2
(45) Date of Patent: Apr. 16, 2024

(54) PHASE-LOCKED LOOP CIRCUIT, CORRESPONDING RADAR SENSOR, VEHICLE AND METHOD OF OPERATION

(71) Applicant: STMicroelectronics S.r.l., Agrate Brianza (IT)

(72) Inventors: Alessandro Finocchiaro, Catania (IT); Alessandro Parisi, Mascalucia (IT); Andrea Cavarra, Catania (IT); Giuseppe Papotto, Biancavilla (IT); Giuseppe Palmisano, s. Giovanni la Punta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 372 days.

(21) Appl. No.: 17/395,080

(22) Filed: Aug. 5, 2021

(65) Prior Publication Data
US 2022/0043136 A1 Feb. 10, 2022

(30) Foreign Application Priority Data
Aug. 7, 2020 (IT) .......................... 102020000019765

(51) Int. Cl.
*G01S 13/34* (2006.01)
*G01S 13/931* (2020.01)
(Continued)

(52) U.S. Cl.
CPC ............ *G01S 13/34* (2013.01); *G01S 13/931* (2013.01); *H03B 5/1231* (2013.01); *H03L 7/193* (2013.01)

(58) Field of Classification Search
CPC ............ H03L 7/103; H03L 7/099; H03L 7/16
See application file for complete search history.

(56) References Cited

U.S. PATENT DOCUMENTS 6,114,920 A 9/2000 Moon et al.
6,496,075 B2 12/2002 Justice et al.
(Continued)

FOREIGN PATENT DOCUMENTS

EP 3439180 A1 2/2019
WO 02073789 A1 9/2002

OTHER PUBLICATIONS

Hou, C., et al, "A 20 Ghz PLL for 40 Gbps SerDes application with 4 bit switch-capacitor adaptive controller," 2014 IEEE International Conference on Electron Devices and Solid-State Circuits, Chengdu, 2014, pp. 1-2.
(Continued)

*Primary Examiner* — Bernarr E Gregory
(74) *Attorney, Agent, or Firm* — Crowe & Dunlevy LLC

(57) ABSTRACT

A PLL has a tunable resonator including an inductance and variable capacitance coupled between first and second nodes, and capacitances coupleable between the nodes. A control node is coupled to the variable capacitance and receives a control signal for tuning the resonator. A biasing circuit biases the resonator to generate an output. A PFD circuit senses timing offset of the output with respect to a reference and asserts first or second digital signals dependent on the sign of the timing offset. A charge pump generates the control signal based on the first and second digital signals. A timer asserts a timing signal in response to a pulse sensed in a reset signal and de-asserts the timing signal after a time interval. A calibrator couples selected capacitances between the first and second nodes as a function of the second digital signal, in response to assertion of the timing signal.

21 Claims, 9 Drawing Sheets

(51) Int. Cl.
 *H03B 5/12* (2006.01)
 *H03L 7/193* (2006.01)
 *G01S 13/00* (2006.01)

(56) References Cited

U.S. PATENT DOCUMENTS

| | | | | |
|---|---|---|---|---|
| 6,496,556 | B1* | 12/2002 | Huehne | H03L 7/104 |
| | | | | 331/34 |
| 7,728,676 | B2 | 6/2010 | Nathawad et al. | |
| 7,764,129 | B1* | 7/2010 | Wong | H03L 7/087 |
| | | | | 331/11 |
| 7,973,612 | B2* | 7/2011 | Raghunathan | H03L 7/099 |
| | | | | 331/34 |
| 8,432,204 | B1* | 4/2013 | Chern | H03L 7/102 |
| | | | | 327/148 |
| 9,240,795 | B2* | 1/2016 | Reichelt | H03L 7/102 |
| 10,833,685 | B1 | 11/2020 | Chakraborty et al. | |
| 2003/0222726 | A1 | 12/2003 | Yonekawa et al. | |
| 2004/0242175 | A1* | 12/2004 | Lin | H03L 7/099 |
| | | | | 455/147 |
| 2004/0257722 | A1* | 12/2004 | Glenn | H03L 7/099 |
| | | | | 361/15 |
| 2005/0110537 | A1* | 5/2005 | Wurzer | H03L 7/099 |
| | | | | 327/156 |
| 2005/0134336 | A1* | 6/2005 | Goldblatt | H03L 7/18 |
| | | | | 327/156 |
| 2006/0003720 | A1* | 1/2006 | Lee | H03L 7/099 |
| | | | | 455/76 |
| 2006/0226916 | A1* | 10/2006 | Florescu | H03L 7/103 |
| | | | | 331/16 |
| 2008/0136535 | A1* | 6/2008 | Khorram | H03L 7/104 |
| | | | | 331/44 |
| 2008/0284526 | A1* | 11/2008 | Hughes | H03L 7/103 |
| | | | | 331/18 |
| 2009/0237132 | A1* | 9/2009 | Wang | H03L 7/18 |
| | | | | 327/157 |
| 2010/0073051 | A1* | 3/2010 | Rao | H03L 7/099 |
| | | | | 327/157 |
| 2011/0215848 | A1* | 9/2011 | Koroglu | H03L 7/099 |
| | | | | 327/157 |
| 2012/0326795 | A1* | 12/2012 | Chiu | H03L 7/099 |
| | | | | 331/17 |
| 2013/0076450 | A1* | 3/2013 | Rao | H03L 7/099 |
| | | | | 331/34 |
| 2013/0082754 | A1* | 4/2013 | Chern | H03L 7/102 |
| | | | | 327/156 |
| 2014/0218124 | A1* | 8/2014 | Tang | H03L 7/16 |
| | | | | 331/34 |
| 2016/0365890 | A1 | 12/2016 | Reynolds et al. | |
| 2017/0085270 | A1 | 3/2017 | Suzuki et al. | |
| 2017/0264333 | A1* | 9/2017 | Hoshino | H03L 7/099 |
| 2018/0269830 | A1* | 9/2018 | Hoshino | H03L 7/099 |
| 2021/0364619 | A1 | 11/2021 | Landsberg et al. | |

OTHER PUBLICATIONS

Shi, C., et al, "A dual loop dual VCO CMOS PLL using a novel coarse tuning technique for DTV," 2008 9th International Conference on Solid-State and Integrated-Circuit Technology, Beijing, 2008, pp. 1597-1600.

IT Search Report and Written Opinion for IT Appl. No. 102020000019765 dated Apr. 19, 2021 (9 pages).

* cited by examiner

PHASE-LOCKED LOOP CIRCUIT, CORRESPONDING RADAR SENSOR, VEHICLE AND METHOD OF OPERATION

PRIORITY CLAIM

This application claims the priority benefit of Italian Application for Patent No. 102020000019765, filed on Aug. 7, 2020, the content of which is hereby incorporated by reference in its entirety to the maximum extent allowable by law.

TECHNICAL FIELD

This disclosure relates to phase-locked loop (PLL) circuits. Embodiments as described herein may be used, for instance, in radar detection systems, such as those increasingly used in automotive advanced driver assistance systems (ADAS).

BACKGROUND

Short-range radar sensors and/or long-range radar sensors may be placed around a vehicle (e.g., a car) to detect objects near and/or around the vehicle. Radar sensor data can be processed (e.g., by a processing unit in the vehicle) and used by systems within the vehicle to prevent an accident, prepare the vehicle for an accident, or take actions to reduce the severity of an accident. Purely by way of example, possible applications of advanced driver assistance systems are adaptive cruise control, pre-crash safety systems, blind spot detection, lane change assistance, etc.

Conventional (e.g., standard) specifications for the operational frequency band of short-range radar sensors and long-range radar sensors are 77 GHz to 81 GHz and 76 GHz to 77 GHz, respectively. Those frequency bands correspond to wavelengths in the order of a few millimeters (mm, 1 mm=$10^{-3}$ m).

Frequency-modulated continuous-wave (FMCW) radar systems may be used for such mm-wave radar applications in the automotive sector. The frequency-modulated continuous-wave radar working principle is exemplified in FIG. 1, which is a diagram exemplary of a possible time-frequency relationship of radar signals in a FMCW radar system.

As exemplified in FIG. 1, a FMCW radar system may transmit (e.g., periodically) a transmission signal TX (exemplified by the solid line in FIG. 1), also referred to as a "chirp", whose frequency sweeps (e.g., linearly) a frequency range F over a certain time interval $T_m$ (e.g., having a duration $T_m$ in the range of 10 µs to 40 µs, 1 µs=$10^{-6}$ s). For instance, the frequency range F may be a 4-GHz range between 77 GHz and 81 GHz for a short-range radar, or a 1-GHz range between 76 GHz and 77 GHz for a long-range radar.

The FMCW radar system may subsequently receive a corresponding echo signal RX (exemplified by the dash-and-dot line in FIG. 1) generated by reflection of the transmission signal TX at a target object.

As exemplified in FIG. 1, the FMCW radar system may detect a first time instant $t_1$ when the frequency of the transmission signal TX is equal to a reference value $f_1$, with $f_1$ comprised in the frequency range F. The FMCW radar system may subsequently detect a second time instant $t_2$ when the frequency of the echo signal RX is equal to the reference value $f_1$, and detect the frequency $f_2$ of the transmission signal TX at the second time instant $t_2$. The FMCW radar system may thus compute a frequency value $f_R$ as a difference between the frequency $f_2$ and the reference frequency $f_1$.

The time interval $t_R$ between the first time instant $t_1$ and the second time instant $t_2$ is a function of (e.g., is proportional to) the distance R between the radar sensor and the target object, according to the following equation, where c is the propagation speed of the radar signals TX and RX:

$$t_R = \frac{2R}{c}$$

The slope of the "chirp" of the radar signal TX as exemplified in FIG. 1 may be computed according to the following equation:

$$\text{slope} = \frac{F}{T_m} = \frac{f_R}{t_R} = \frac{f_R}{\frac{2R}{c}}$$

Therefore, the distance R between the radar sensor and the target object may be computed as follows:

$$R = \frac{f_R \cdot c \cdot T_m}{2F}$$

A phase locked loop (PLL) circuit comprising a voltage-controlled oscillator (VCO) may be used in a FMCW radar detection system to generate variable frequency signals (e.g., to generate "chirp" signals). The voltage-controlled oscillator may comprise a tunable LC resonant circuit.

The use of calibration techniques in PLL circuits to adjust the tuning curve within the target frequency bandwidth F is known in the art.

For instance, known calibration techniques may comprise compensating the frequency variations induced by process, voltage and temperature (PVT) variations by acting on the LC resonant circuit through the control voltage of the voltage-controlled oscillator in closed loop condition to adjust the VCO output frequency. For instance, known calibration techniques may comprise sensing the VCO control voltage and selectively enabling/disabling one or more unit capacitors of a capacitor array of the LC resonant circuit as a function of the sensed VCO control voltage. The resulting calibration time may turn out to be long, insofar as a delay equal to (at least) the PLL settling time may be required at each calibration step (e.g., one PLL settling time at each insertion or activation of a unit capacitor in the array of capacitors). Thus, in conventional automotive radar applications, the calibration routine can be performed only at the start-up of the radar system.

Therefore, improved calibration strategies for voltage-controlled oscillators in PLL circuits may be desirable.

SUMMARY

An object of one or more embodiments is to contribute in providing such improved solutions.

According to one or more embodiments, such an object can be achieved by a circuit having the features set forth in the claims that follow.

One or more embodiments may relate to a corresponding radar sensor.

One or more embodiments may relate to a corresponding vehicle.

One or more embodiments may relate to a corresponding method of operating the circuit.

According to one or more embodiments, a circuit (e.g., a PLL circuit) is provided which may include: a tunable resonant circuit having a first node and a second node, and including an inductance coupled between the first node and the second node, a variable capacitance coupled between the first node and the second node, and a set of capacitances selectively coupleable between the first node and the second node; a control node coupled to the variable capacitance, the control node configured to receive a control signal, wherein the tunable resonant circuit is tunable as a function of the control signal; a biasing circuit coupled to the tunable resonant circuit and configured to bias the tunable resonant circuit to generate a variable-frequency output signal between the first node and the second node; a phase-frequency detector circuit sensitive to an input reference signal and to the variable-frequency output signal and configured to generate a first digital control signal and a second digital control signal as a function of a timing offset of the variable-frequency output signal with respect to the input reference signal, wherein the first digital control signal being asserted is indicative of a first operational state wherein the timing offset has a first sign, and wherein the second digital control signal being asserted is indicative of a second operational state wherein the timing offset has a second sign, opposite the first sign; a charge pump circuit and a filter circuit configured to generate the control signal as a function of the first digital control signal and the second digital control signal; a timer circuit sensitive to a reset signal and configured to generate a timing signal, wherein the timing signal is asserted in response to a pulse sensed in the reset signal and de-asserted after a time interval from the sensed pulse; and a calibration circuit configured to selectively couple between the first node and the second node selected capacitances in the set of capacitances as a function of the second digital control signal in response to the timing signal being asserted.

One or more embodiments may thus facilitate carrying out a fast calibration of a PLL circuit, e.g., suitable for being executed between subsequent chirp signals during operation of an automotive radar sensor.

BRIEF DESCRIPTION OF THE DRAWINGS

One or more embodiments will now be described, by way of example only, with reference to the annexed figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, certain structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The headings/references used herein are provided merely for convenience and hence do not define the extent of protection or the scope of the embodiments.

For simplicity, throughout the figures annexed herein, like parts or elements are indicated with like references/numerals. For brevity, a corresponding description will not be repeated for each and every figure.

Figure 1:
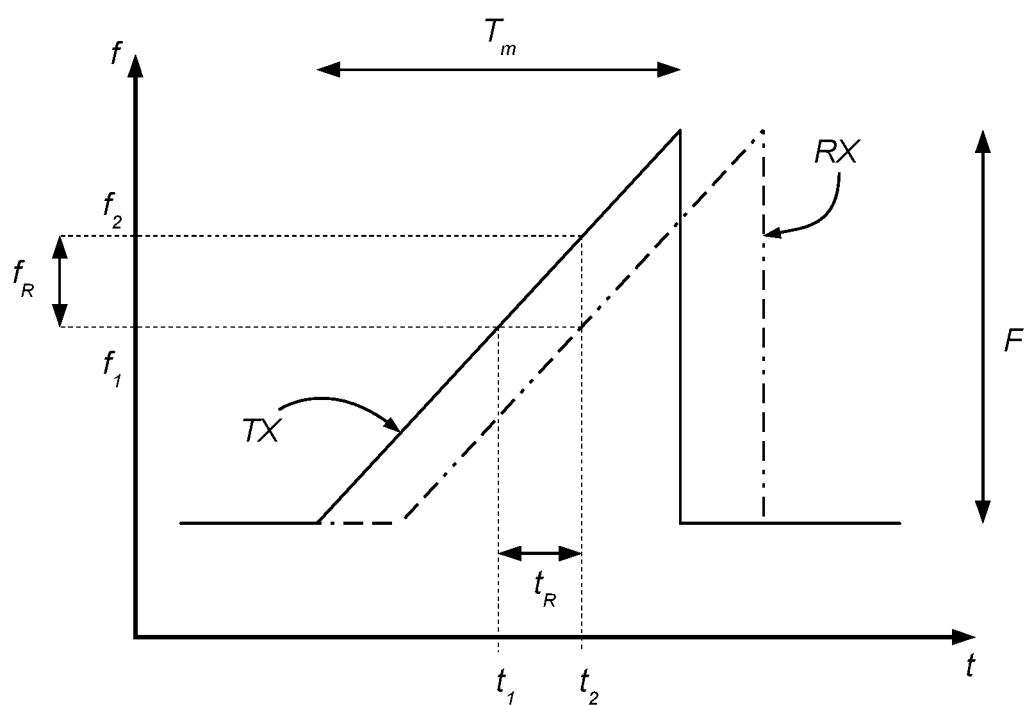
FIG. 1, which was described in the foregoing, is a diagram exemplary of a possible time-frequency relationship of radar signals in a frequency-modulated continuous-wave (FMCW) radar system.
Figure 2:
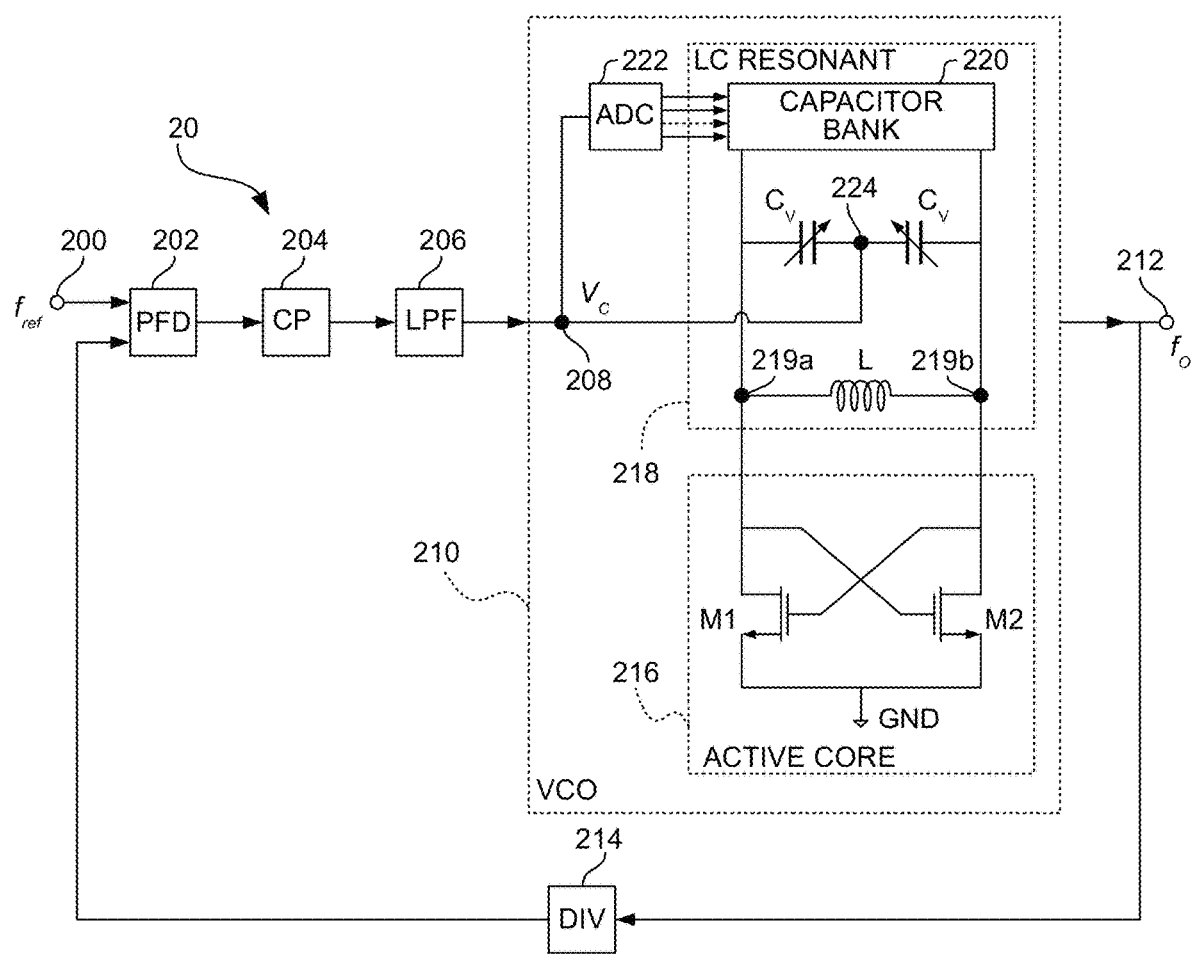
FIG. 2 is a circuit block diagram exemplary of a PLL circuit as possibly used in a radar sensor.

By way of introduction to the detailed description of exemplary embodiments, reference may first be made to FIG. 2.

FIG. 2 is a circuit block diagram exemplary of a PLL circuit 20 as possibly used in a radar sensor. For instance, the PLL circuit 20 may rely on a suitable calibration strategy.

The PLL circuit 20 may comprise: an input node 200 configured to receive an input reference signal $f_{ref}$; a phase-frequency detector (PFD) circuit 202 having a first input configured to receive the input reference signal $f_{ref}$; a charge pump (CP) circuit 204 coupled at the output of the phase-frequency detector circuit 202; a low-pass filter circuit 206 coupled at the output of the charge pump circuit 204 and configured to generate, at a respective output node 208, a control signal $V_C$; a voltage-controlled oscillator (VCO) circuit 210 coupled at node 208 and controlled by the control signal $V_C$, the voltage-controlled oscillator circuit 210 configured to generate at an output node 212 an output signal $f_O$; and a feedback loop configured to provide the output signal $f_O$ at a second input of the phase-frequency detector circuit 202.

The feedback loop may optionally comprise a frequency divider circuit 214.

As exemplified in FIG. 2, the voltage-controlled oscillator circuit 210 may comprise an active core 216 (e.g., a biasing circuit) coupled to an LC resonant circuit 218.

The active core 216 may comprise a pair of transistors M1 and M2, e.g., metal-oxide semiconductor (MOS) field-effect transistors. As exemplified in FIG. 2, a first transistor M1 may have a source terminal coupled to a voltage reference node (e.g., ground GND) and a drain terminal coupled to a first terminal 219a of the LC resonant circuit 218, and a second transistor M2 may have a source terminal coupled to the voltage reference node GND and a drain terminal coupled to a second terminal 219b of the LC resonant circuit 218. The control (gate) terminal of the first transistor M1 may be coupled to the drain terminal of the second transistor M2, and the control (gate) terminal of the second transistor M2 may be coupled to the drain terminal of the first transistor M1.

As exemplified in FIG. 2, the LC resonant circuit 218 may comprise an inductive component and a capacitive component coupled between the first terminal 219a and the second terminal 219b.

As exemplified herein, the inductive component may comprise an inductor L and the capacitive component may comprise one or more (e.g., a pair of) variable capacitors or varactors $C_V$, e.g., coupled in series between terminals 219a and 219b.

As exemplified herein, the control signal $V_C$ may be applied at a node 224 intermediate the two varactors $C_V$.

As exemplified in FIG. 2, the LC resonant circuit 218 may further comprise an array (or bank) of capacitors 220 coupled in parallel to the varactor(s) $C_V$. The array of capacitors 220 may be configured to receive a set of configuration signals from an analog-to-digital converter circuit 222. The analog-to-digital converter 222 may be coupled to node 208 to receive the control signal $V_C$. For instance, the analog-to-digital converter 222 may comprise an N-bit ADC and the array of capacitors 220 may comprise $2^N$ unit capacitors.

The configuration signals (e.g., an N-bit binary signal generated by the ADC 222) may be used to activate and de-activate a set of switches respectively coupled to the capacitors in the array of capacitors 220, so that the overall capacitance of the capacitive component of the LC resonant circuit 218 may be changed to tune the output frequency of the voltage-controlled oscillator 210.

In a PLL circuit 20 as exemplified in FIG. 2, the analog-to-digital converter 222 and the array of capacitors 220 may be used to perform an adjustment (e.g., a calibration) of the tuning curve of the LC resonant circuit 218 to compensate the effect of process, voltage and/or temperature variations. This calibration strategy may advantageously avoid the use of large varactors which may lead to high power consumption and high phase noise.

Figure 3:
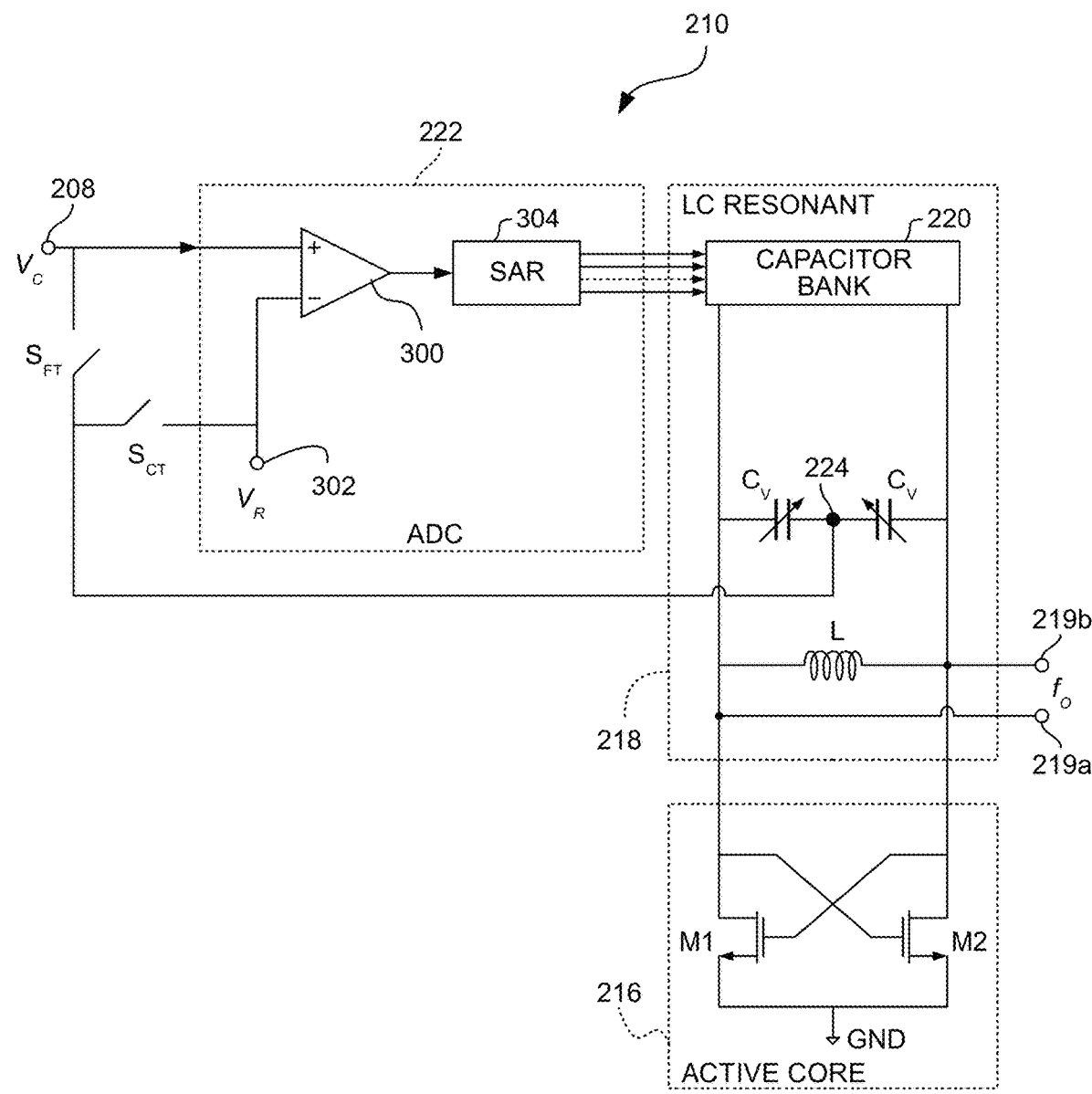
FIG. 3 is a circuit block diagram exemplary of a voltage-controlled oscillator circuit as possibly used in a PLL circuit.

As exemplified in FIG. 3, which is a circuit block diagram exemplary of possible implementation details of a voltage-controlled oscillator circuit 210 for use in a PLL circuit 20, the analog-to-digital converter 222 may comprise a successive approximation analog-to-digital converter (SA-ADC) configured to calibrate the LC resonant circuit.

A successive approximation analog-to-digital converter may comprise a comparator circuit 300 having a first (e.g., non-inverting) input coupled to node 208 to receive the control signal $V_C$ and a second (e.g., inverting) input coupled to a node 302 to receive a reference voltage signal $V_R$. For instance, the reference voltage signal $V_R$ may be equal to half of a supply voltage $V_{CC}$ of the PLL circuit 20 (i.e., $V_R = V_{CC}/2$). The successive approximation analog-to-digital converter may further comprise a successive approximation register (SAR) 304 configured to receive an output signal from the comparator circuit 300 and to provide the N-bit configuration signal to the array of capacitors 220.

As exemplified in FIG. 3, a first switch $S_{FT}$ may be arranged in the propagation path between the configuration node of the LC resonant circuit 218 (here, the node 224 intermediate the varactors $C_V$) and the first input of the comparator circuit 300 (e.g., node 208), and a second switch $S_{CT}$ may be arranged in the propagation path between the configuration node of the LC resonant circuit 218 and the second input of the comparator circuit 300 (e.g., node 302).

Therefore, calibration and tuning of a voltage-controlled oscillator circuit 210 as exemplified in FIG. 3 may be performed in two steps to avoid instability.

In the calibration step, the first switch $S_{FT}$ is opened and the second switch $S_{CT}$ is closed. The varactor(s) $C_V$ provide a constant capacitance value (e.g., an average value) and the ADC converter 222 achieves calibration of the LC resonant circuit 218 by enabling a selected subset of the capacitors in the array of capacitors 220.

In the tuning step, the first switch $S_{FT}$ is closed and the second switch $S_{CT}$ is opened. The varactor(s) $C_V$ is connected to the control voltage $V_C$ and changes its capacitance value to provide a frequency tuning within the calibrated tuning curve.

The solution described above may not be satisfactory insofar as the calibration step may take a long time (e.g., N times the settling time of the PLL circuit), and as a result, calibration may be performed only at the start-up of the radar system.

One or more embodiments may thus aim at providing an improved calibration system for a PLL circuit to be used, for instance, in an automotive radar application.

Figure 4A:
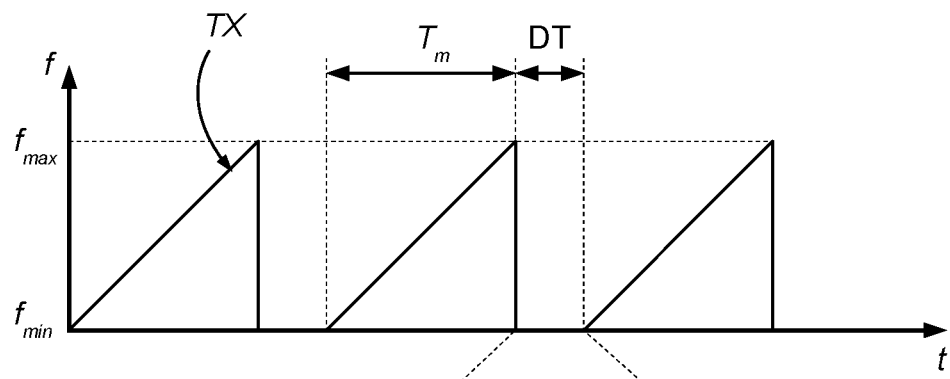
FIGS. 4A and 4B are diagrams exemplary of possible time-frequency relationship of signals in one or more embodiments of the present description.
Figure 4B:
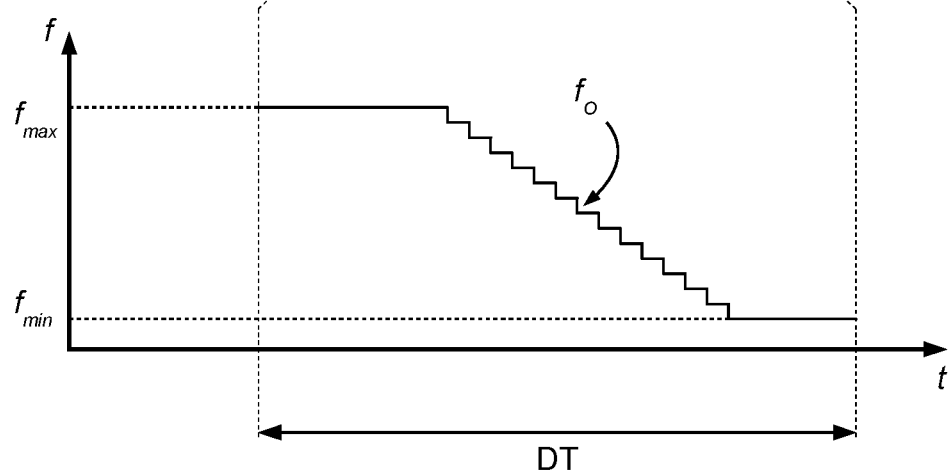

In that respect, one or more embodiments may rely on a dynamic calibration performed during the dead time DT between subsequent "chirp" signals, as exemplified in FIGS. 4A and 4B.

FIG. 4A is a diagram exemplary of a possible time-frequency relationship of a radar transmission signal TX in one or more embodiments. As previously discussed, the transmission signal TX may comprise plural "chirps" (i.e., frequency sweeps between a lower frequency $f_{min}$ and an upper frequency $f_{max}$) having a duration $T_m$ (e.g., around 10 µs, 1 µs=$10^{-6}$ s). The duration of the dead time DT which separates subsequent chirps may be, for instance, around 2 µs.

The duration of the dead time DT or "inter-chirp idle time" (which may comprise a calibration phase) may depend on the settling time of the PLL circuit. In other words, during a dead time the PLL circuit may stabilize by bringing the operating frequency of the LC resonant circuit from the maximum value $f_{max}$ to the minimum value $f_{min}$, before starting a new frequency sweep (e.g., a new chirp).

FIG. 4B is a diagram exemplary of a possible time-frequency relationship of the output signal $f_O$ generated by the voltage-controlled oscillator during a dead time DT in one or more embodiments (it is noted that the time scales of FIG. 4A and FIG. 4B are thus not the same). As exemplified in FIG. 4B, the frequency of the output signal $f_O$ may be decreased from $f_{max}$ to $f_{min}$ in a quantized or staircase-like manner, e.g., by progressively (or sequentially) activating the capacitors in the array of capacitors 220.

Figure 5:
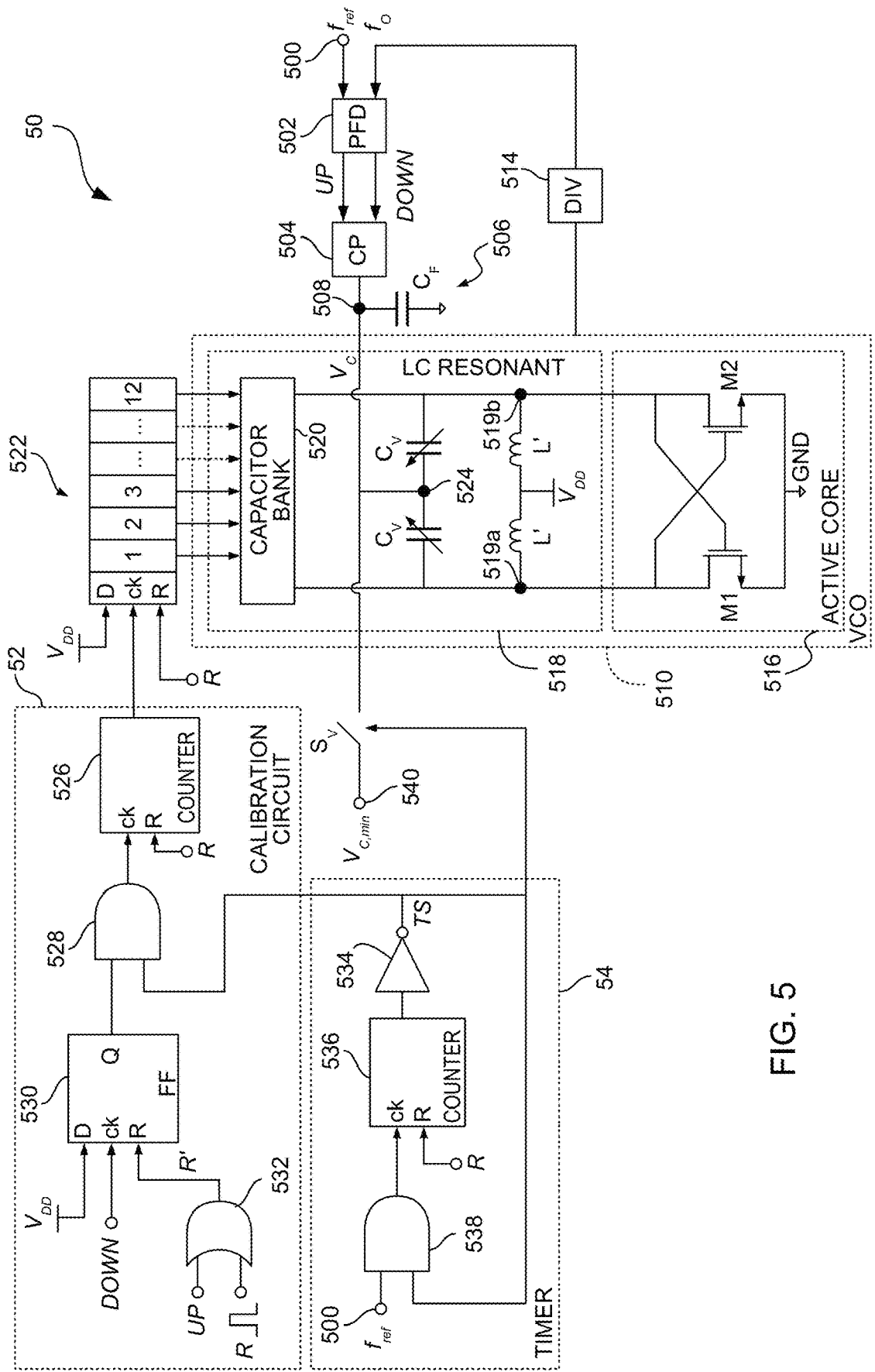
FIG. 5 is a circuit block diagram exemplary of a PLL circuit according to one or more embodiments of the present description.

FIG. 5 is a circuit block diagram exemplary of certain components of a PLL circuit 50 according to one or more embodiments, e.g., for use in a radar sensor.

In one or more embodiments, a PLL circuit 50 may comprise: an input node 500 configured to receive an input reference signal $f_{ref}$ (e.g., at a frequency of 100 MHz); a phase-frequency detector (PFD) circuit 502 having a first input configured to receive the input reference signal $f_{ref}$ the phase-frequency detector circuit 502 being configured to generate (in an otherwise conventional manner) digital control signals UP and DOWN; a charge pump (CP) circuit 504 coupled at the output of the phase-frequency detector circuit 502 and configured to receive therefrom the digital control signals UP and DOWN; a low-pass filter circuit 506 coupled at the output of the charge pump circuit 504 and configured to generate, at a respective output node 508, a control signal $V_C$; a voltage-controlled oscillator (VCO) circuit 510 coupled at node 508 and controlled by the control signal $V_C$, the voltage-controlled oscillator circuit 510 configured to generate an output signal $f_O$ (e.g., between nodes 519a and 519b); and a feedback loop configured to provide the output signal $f_O$ at a second input of the phase-frequency detector circuit 502.

The feedback loop may optionally comprise a frequency divider circuit 514.

As exemplified in FIG. 5, the low-pass filter circuit 506 may comprise a filter capacitor $C_F$ coupled between node 508 and a reference voltage node GND.

As exemplified in FIG. 5, the voltage-controlled oscillator circuit 510 may comprise an active core 516 (e.g., a biasing circuit) coupled to an LC resonant circuit 518.

The active core 516 may comprise a pair of transistors M1 and M2, e.g., MOS field-effect transistors. As exemplified in FIG. 5, a first transistor M1 may have a source terminal coupled to the reference voltage node GND (e.g., ground) and a drain terminal coupled to the first terminal 519a of the LC resonant circuit 518, and a second transistor M2 may have a source terminal coupled to the reference voltage node GND and a drain terminal coupled to the second terminal 519b of the LC resonant circuit 518. The control (gate) terminal of the first transistor M1 may be coupled to the drain terminal of the second transistor M2, and the control (gate) terminal of the second transistor M2 may be coupled to the drain terminal of the first transistor M1.

As exemplified in FIG. 5, the LC resonant circuit 518 may comprise an inductive component and a capacitive component coupled between the first terminal 519a and the second terminal 519b of the LC resonant circuit 518.

As exemplified in FIG. 5, the inductive component may comprise one or more inductors L'. For instance, the inductive component may comprise a pair of inductors L', with a supply voltage $V_{DD}$ applied at a node intermediate the two inductors L'. By way of example, the supply voltage $V_{DD}$ may be a supply voltage for a logic circuit, e.g., equal to about 1 V.

As exemplified in FIG. 5, the capacitive component may comprise one or more (e.g., a pair of) variable capacitors or varactors $C_V$ coupled in series. As exemplified herein, the control signal $V_C$ may be applied at a node 524 intermediate the two varactors $C_V$.

As exemplified in FIG. 5, the LC resonant circuit 518 may further comprise an array (or bank) of capacitors 520 coupled in parallel to the varactor(s) $C_V$.

The array of capacitors 520 may be configured to receive a set of configuration signals from a calibration circuit 52. The configuration signals may be used to activate and de-activate a set of switches respectively coupled to the capacitors in the array of capacitors 520, so that the overall capacitance of the capacitive component of the LC resonant circuit 518 may be changed to tune the output frequency of the voltage-controlled oscillator 510.

In one or more embodiments, the calibration circuit 52 may comprise a register 522 (e.g., a twelve-bit register). The register 522 may comprise a serial-in parallel-out (SIPO) register. The SIPO register 522 may have a data-in input D configured to be coupled to a voltage signal providing a high logic value, e.g., the supply voltage $V_{DD}$. The SIPO register 522 may have a reset input R configured to receive a reset signal R. The SIPO register 522 may have a clock input ck configured to receive a digital (e.g., pulsed) signal generated by an integrator circuit.

In one or more embodiments, the reset signal R may comprise pulses corresponding to the start of dead time intervals DT between the transmitted chirp signals.

As exemplified in FIG. 5, the integrator circuit may comprise a digital integrator implemented by a counter circuit 526. The counter circuit 526 may have a reset input R configured to receive the reset signal R, and a clock input ck configured to receive a digital (e.g., pulsed) signal generated at the output of an AND logic gate 528. For instance, the counter circuit 526 may have a counter modulus of $2^3$, i.e., it may generate a pulse at its output as a result of a number $2^3=8$ of pulses received at the respective clock input ck.

As exemplified in FIG. 5, the AND logic gate 528 may have a first input configured to receive an output signal from an edge-triggered D flip-flop circuit 530. The D flip-flop circuit 530 may have a data-in input D configured to be coupled to a voltage signal providing a high logic value, e.g., the supply voltage $V_{DD}$. The D flip-flop circuit 530 may have a clock input ck configured to receive the digital control signal DOWN generated by the phase-frequency detector circuit 502. The D flip-flop circuit 530 may have a reset input R configured to receive a reset signal R' from the output of an OR logic gate 532.

As exemplified in FIG. 5, the OR logic gate 532 may have a first input configured to receive the digital control signal UP generated by the phase-frequency detector circuit 502, and a second input configured to receive the reset signal R. Therefore, the reset signal R' may comprise pulses corresponding to pulses in the reset signal R and pulses in the control signal UP.

As exemplified in FIG. 5, the AND logic gate 528 may have a second input configured to receive a timing signal TS from a timer circuit 54.

For instance, the timing signal TS may be generated as an inverted replica (by an inverter circuit 534) of an output signal from a counter circuit 536.

As exemplified in FIG. 5, the counter circuit 536 may have a reset input R configured to receive the reset signal R, and a clock input ck configured to receive a digital (e.g., pulsed) signal generated at the output of an AND logic gate 538. For instance, the counter circuit 536 may have a counter modulus of $2^7$, i.e., it may generate a pulse at its output as a result of a number $2^7=128$ of pulses received at the respective clock input ck.

As exemplified in FIG. 5, the AND logic gate 538 may have a first input configured to receive the reference signal $f_{ref}$ (e.g., by coupling to node 500) and a second input configured to receive the timing signal TS (e.g., via a feedback loop of the timer circuit 54).

As exemplified in FIG. 5, the PLL circuit 50 may comprise a switch $S_V$ configured to selectively couple the control node 508 of the voltage-controlled oscillator 510 to a node 540 providing a reference control voltage $V_{C,min}$.

The switch $S_V$ may be controlled by the timing signal TS. For instance, the switch $S_V$ may be close during the calibration phase of the PLL circuit 50 (e.g., during the dead times DT between the chirp signals) and may be open during the transmission phase of signal TX.

Therefore, in one or more embodiments a counter circuit 536 may be used to set the timing of the calibration phase. The calibration may start with a reset pulse in the reset signal R at the beginning of a dead time. The dynamic calibration may rely on (digital) integration of the control signal DOWN, e.g., exploiting pulses in the signal DOWN to advance the counter 526 (e.g., a $2^3$ counter). The output signal from the counter 526 may be used to trigger shifts of the register 522, thereby generating a thermometer code (e.g., a 12-bit thermometer code) for activating (e.g., inserting via respective switches) the capacitors in the array of capacitors 520. For instance, each shift of the value of the register 522 may result in a unit capacitor in the array of capacitors 520 being coupled in parallel to the varactors $C_V$ of the LC resonant circuit 518.

In one or more embodiments, the counter circuit 536 (e.g., a $2^7$ counter) may define the whole calibration time.

Figure 6:
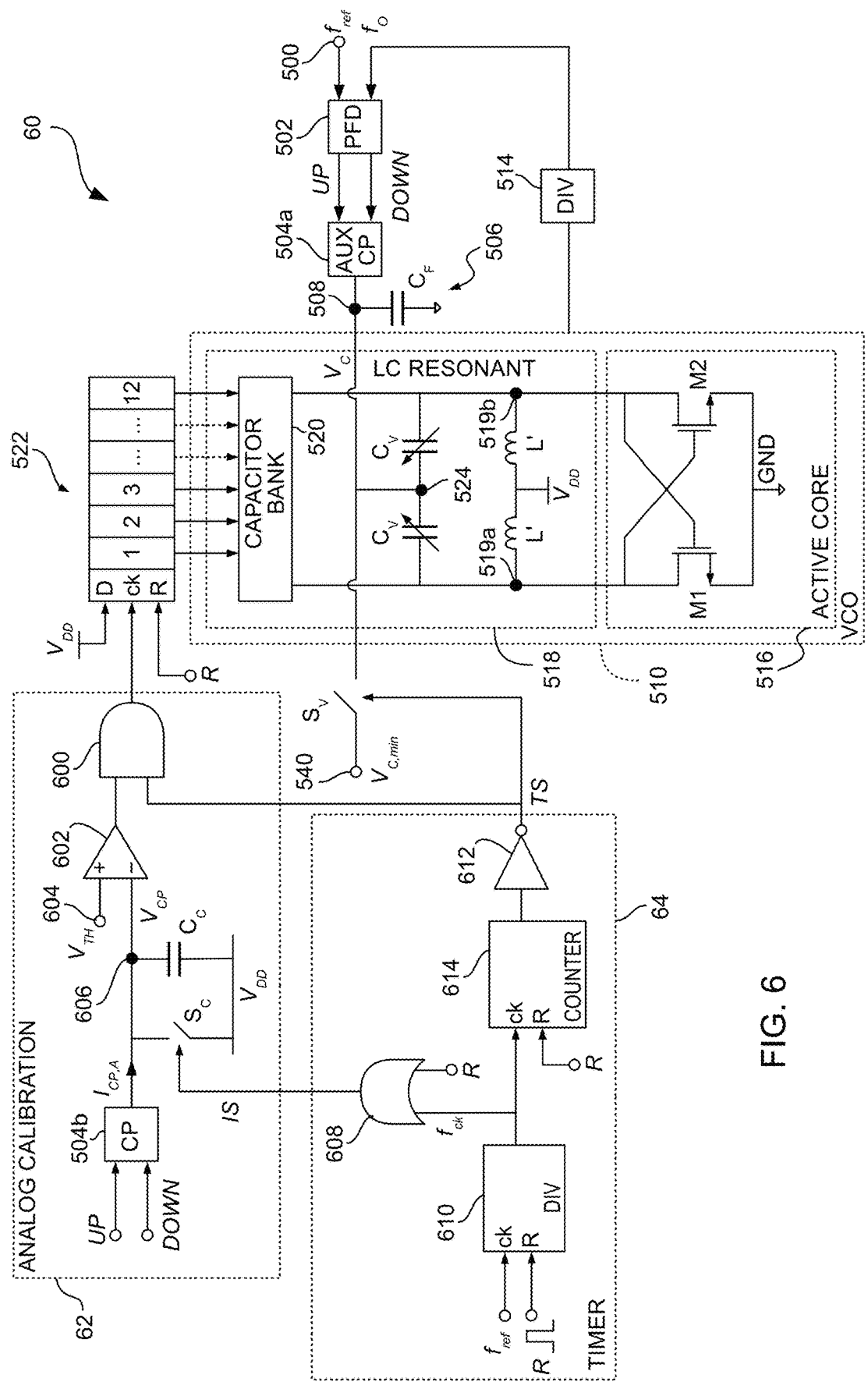
FIG. 6 is a circuit block diagram exemplary of another PLL circuit according to one or more embodiments of the present description.

FIG. 6 is a circuit block diagram exemplary of another PLL circuit 60 according to one or more embodiments, e.g., for use in a radar sensor.

Differently from the circuit exemplified in FIG. 5, the circuit exemplified in FIG. 6 may rely on an analog calibration circuit 62. The circuit exemplified in FIG. 6 may thus comprise a main charge pump circuit 504a and an auxiliary charge pump circuit 504b coupled to the PFD circuit 502 to receive the signals UP and DOWN. It is noted that, despite being illustrated at different locations of FIG. 5 for ease of illustration, the main and auxiliary charge pump circuits 504a and 504b may be coupled at the output of the same PFD circuit 502.

As exemplified in FIG. 6, the register 522 may comprise a serial-in parallel-out (SIPO) register. The SIPO register 522 may have a data-in input D configured to be coupled to a voltage signal providing a high logic value, e.g., the supply voltage $V_{DD}$. The SIPO register 522 may have a reset input R configured to receive a reset signal R. The SIPO register 522 may have a clock input ck configured to receive a digital (e.g., pulsed) signal generated by an AND logic gate 600.

As exemplified in FIG. 6, the AND logic gate 600 may have a first input configured to receive an output signal from a comparator circuit 602. The comparator circuit 602 may be configured to compare a threshold voltage signal $V_{TH}$ received at a respective first (e.g., non-inverting) input 604 to a voltage signal $V_{CP}$ received at a respective second (e.g., inverting) input 606.

As exemplified in FIG. 6, the auxiliary charge pump circuit 504b may provide an auxiliary pulsed current $I_{CP,A}$ to node 606. The auxiliary current $I_{CP,A}$ may be used to charge an integrator capacitance $C_C$ coupled between node 606 and a supply voltage node providing a supply voltage $V_{DD}$. A switch $S_C$ may be provided in parallel to the integrator capacitance $C_C$ to selectively discharge the integrator capacitance $C_C$.

The switch $S_C$ may be controlled by an integration signal IS generated at an output of a timer circuit 64.

As exemplified in FIG. 6, the timer circuit 64 may comprise an OR logic gate 608 configured to generate the integration signal IS. The OR logic gate 608 may have a first input configured to receive the reset signal R, and a second input configured to receive a signal $f_{ck}$ generated at the output of a frequency divider circuit 610.

The frequency divider circuit 610 (e.g., a divider by factor $2^3=8$) may have a reset input R configured to receive the reset signal R, and a clock input ck configured to receive the reference signal $f_{ref}$ (e.g., the same reference signal of the PLL circuit). In one or more embodiments, providing the reference signal $f_{ref}$ at the clock input ck of the frequency divider circuit 610 may be advantageous, insofar as it may not require an internal clock generator.

As exemplified in FIG. 6, the AND logic gate 600 may have a second input configured to receive a timing signal TS, e.g., an inverted replica (for instance, generated by an inverter circuit 612) of an output signal from a counter circuit 614.

As exemplified in FIG. 6, the counter circuit 614 may have a reset input R configured to receive the reset signal R, and a clock input ck configured to receive the signal $f_{ck}$ generated at the output of the frequency divider circuit 610. For instance, the counter circuit 614 may have a counter modulus of $2^4$, i.e., it may generate a pulse at its output as a result of a number $2^4=16$ of pulses received at the respective clock input ck.

As exemplified in FIG. 6, the PLL circuit 60 may comprise a switch $S_V$ configured to selectively couple the control node 508 of the voltage-controlled oscillator 510 to a node 540 providing a reference control voltage $V_{C,min}$.

The switch $S_V$ may be controlled by the timing signal TS. For instance, the switch $S_V$ may be closed during the calibration phase of the PLL circuit 60 (e.g., during the dead times between the chirp signals) and may be opened during the transmission phase of signal TX.

Therefore, in one or more embodiments a counter circuit 614 may be used to set the timing of the calibration phase. The calibration may start with a reset pulse at the beginning of a dead time.

Dynamic calibration based on analog integration as exemplified in FIG. 6 may exploit the sign of the current $I_{CP,A}$ generated by the auxiliary charge pump circuit 504b to trigger the comparator circuit 602 that drives the register 522.

In one or more embodiments as exemplified in FIG. 6, a commutation of the comparator circuit 602 after the integration of a certain number of current pulses of the auxiliary current $I_{CP,A}$ may trigger a shift of the register 522, thereby generating a thermometer code (e.g., a 12-bit thermometer code) for activating the capacitors in the array of capacitors 520. For instance, each shift of the value of the register 522 may result in a unit capacitor in the array of capacitors 520 being coupled in parallel to the varactors $C_V$ of the LC resonant circuit 518.

The speed of the analog integrator may benefit from relying on an auxiliary charge pump circuit 504b, insofar as the current $I_{CP,A}$, the capacity $C_C$ and the threshold voltage $V_{TH}$ can be sized properly to set the switching time $T_{SW}$ of comparator 602 congruent with the chirp dead time DT. For instance, the current $I_{CP,A}$ and the capacity $C_C$ may be sized once defined the switching time $T_{SW}$, based on the following equation:

$$I_{CP,A} = \frac{C_C \cdot V_{TH}}{T_{SW}}$$

In one or more embodiments as exemplified in FIG. 6, the divider circuit 610 may define the clock period of the clock signals $f_{ck}$. A first semi-period of the clock signals $f_{ck}$ may be used to discharge the capacitance $C_C$, and a second semi-period of the clock signals $f_{ck}$ may be used for charge integration until switching of the comparator 602.

In one or more embodiments as exemplified in FIG. 6, the counter circuit 614 (e.g., a $2^4$ counter) may define the whole calibration time.

Figure 7:
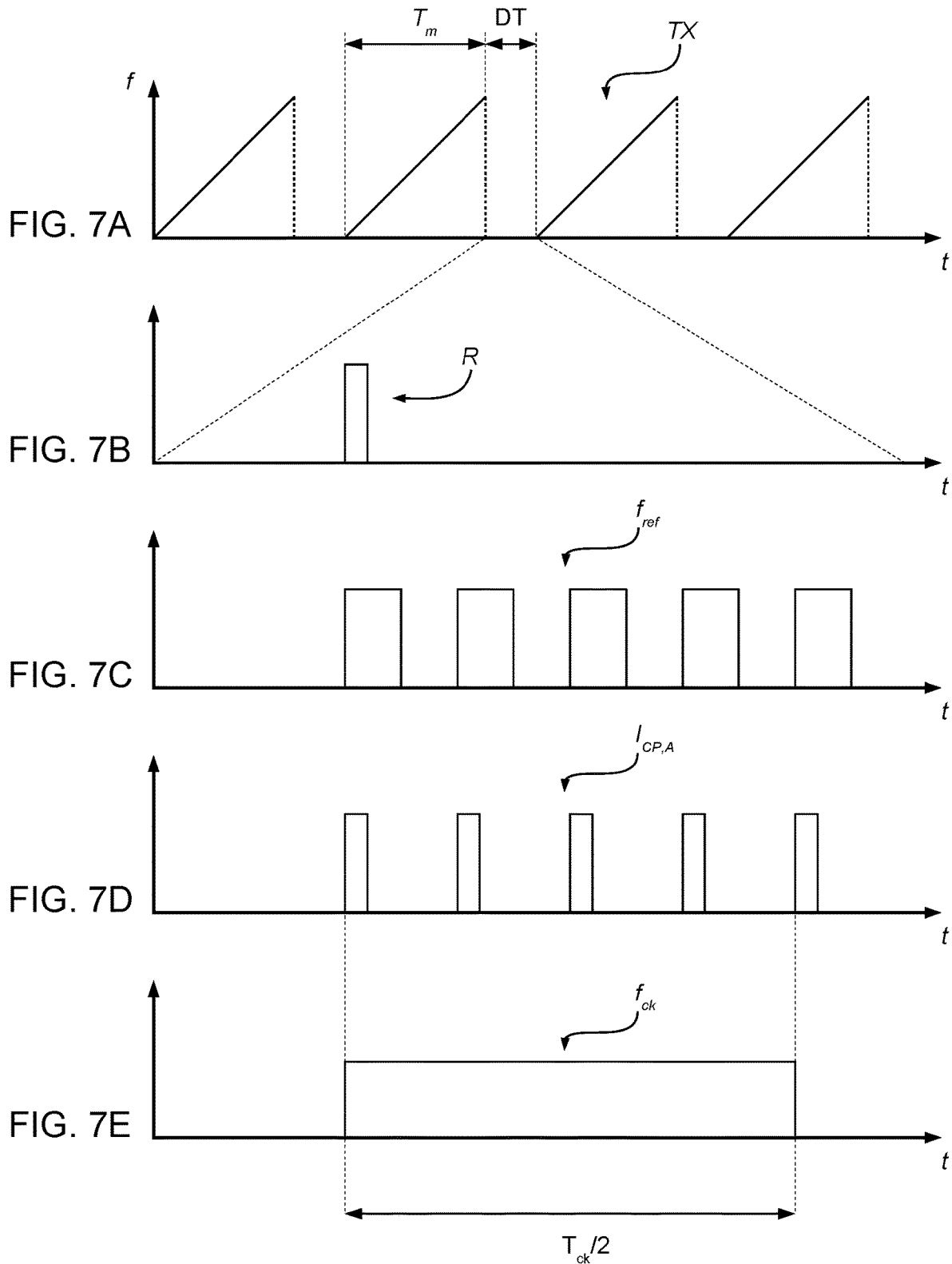
FIGS. 7A to 7E are diagrams exemplary of possible behavior of signals in one or more embodiments of the present description.

FIGS. 7A to 7E are diagrams exemplary of possible time evolution of various signals in one or more embodiments. In particular, FIG. 7A exemplifies a time-frequency relationship of a radar transmission signal TX, FIG. 7B exemplifies a time-amplitude relationship of a reset signal R, FIG. 7C exemplifies a time-amplitude relationship of a reference signal $f_{ref}$ as received at the input node 500 of a PLL circuit 50 or 60, FIG. 7D exemplifies a time-amplitude relationship of an auxiliary current $I_{CP,A}$ as provided by an auxiliary charge pump circuit 504b, and FIG. 7E exemplifies a time-amplitude relationship of a clock signal $f_{ck}$ as generated at the output of the frequency divider circuit 610. It is noted that the time scale of FIG. 7A is different from the time scale of FIGS. 7B to 7E, with these latter figures providing a magnified view of a dead time interval DT between two subsequent chirp signals.

As exemplified in FIG. 7A, the duration $T_m$ of the ramp of a chirp signal may be in the range of 10 μs to 40 μs, and the duration of the dead time DT may be in the range of 2 μs to 10 μs.

As exemplified in FIG. 7B, a reset pulse may be generated in the reset signal R at the beginning or shortly after the beginning of a dead time DT to trigger (or enable) the calibration phase.

As exemplified in FIG. 7C, the reference signal $f_{ref}$ provided at the input node 500 of the PLL circuit may provide a reference time. Purely by way of non-limiting example, the reference signal $f_{ref}$ may have a period of 10 ns (1 ns=$10^{-9}$ s), i.e., a frequency of 100 MHz.

As exemplified in FIG. 7D, the auxiliary current $I_{CP,A}$ generated by the auxiliary charge pump circuit 504b may comprise pulses having a duration of, e.g., 2 ns and the same period of the reference signal $f_{ref}$.

As exemplified in FIG. 7E, the period $T_{ck}$ of the clock signal $f_{ck}$ generated at the output of the frequency divider circuit 610 may be equal to 80 ns (i.e., eight times the period of the reference signal $f_{ref}$, insofar as the divider circuit 610 has modulus $2^3$). Half of the period $T_{ck}$ (e.g., 40 ns) may be used for discharging the integrator capacitance $C_C$, and another half of the period $T_{ck}$ (e.g., another 40 ns) may be used for integration.

Therefore, purely by way of non-limiting example, the overall calibration time may be equal to 1.28 μs in case the reference signal $f_{ref}$ has a frequency of 100 MHz and assuming 4 pulses of the auxiliary current $I_{CP,A}$, wherein each pulse has a duration of 2 ns. The overall calibration time may be equal to sixteen times the period of the clock signal $f_{ck}$, insofar as the counter circuit 614 has modulus $2^4$.

Both digital and analog calibration techniques (e.g., as exemplified with reference to FIGS. 5 and 6, respectively) may be suitable for cellular applications. This first case may involve pre-charging the filter capacitance $C_F$ and the varactor(s) $C_V$ to an average value of the control voltage $V_C$ (e.g., selecting $V_{C,min}$ equal to said average value).

Another solution can be adopted, e.g., with the aim of achieving a higher response speed. This second case may involve pre-charging the filter capacitance $C_F$ and the varactor(s) $C_V$ to a value close to the final value of the control voltage $V_C$.

Figure 8:
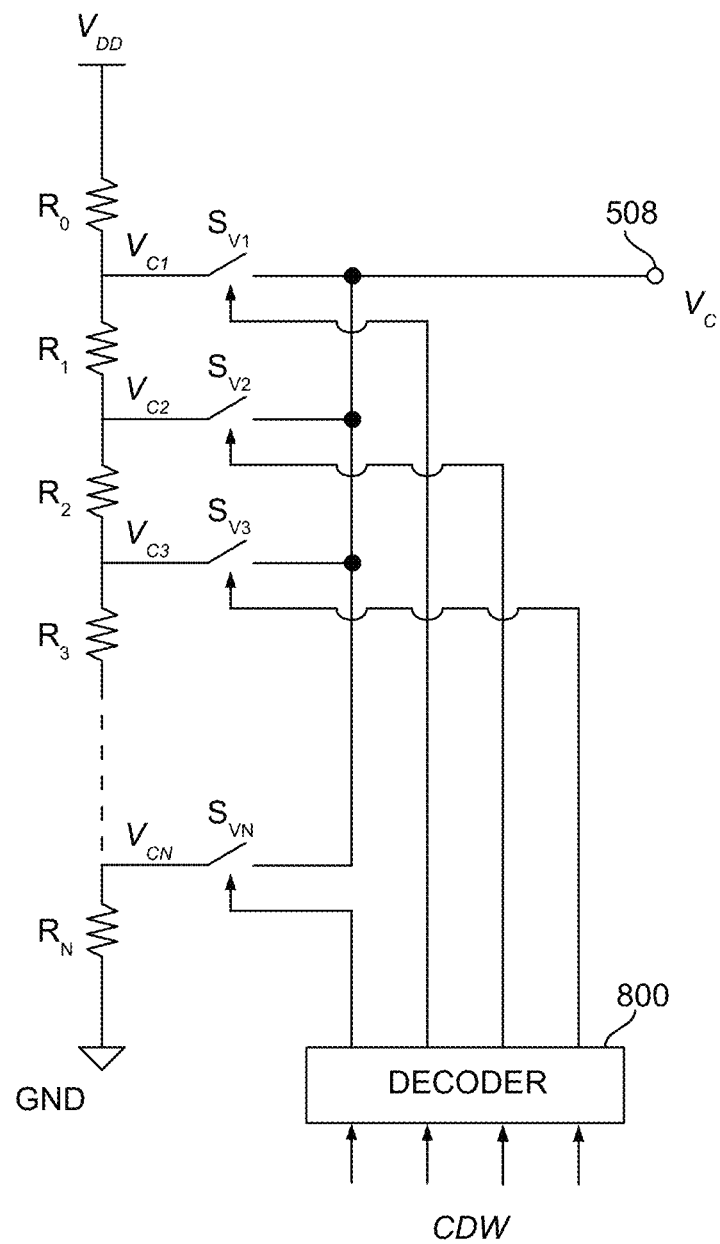
FIG. 8 is a circuit block diagram exemplary of possible implementation details of one or more embodiments of the present description.

Such a second solution may be implemented by replacing the switch $S_V$ with an A/D flash converter, as exemplified in FIG. 8.

As exemplified in FIG. 8, one or more embodiments may comprise a voltage divider network or voltage ladder comprising a set of resistances $R_0, \ldots, R_N$ coupled in series between the supply voltage $V_{DD}$ and ground GND to generate a set of increasing voltage levels $V_{C1}, \ldots, V_{CN}$.

The control node 508 of the voltage-controlled oscillator 510 (to which the filter capacitance $C_F$ and the varactor(s) $C_V$ are coupled) may be selectively coupleable to any of the voltage levels $V_{C1}, \ldots, V_{CN}$ by respective switches $S_{V1}, \ldots, S_{VN}$. The switches $S_{V1}, \ldots, S_{VN}$ may be controlled by respective control signals generated by decoding, at a decoder circuit 800, the most significant bits of the divider programming word (or coarse division word) CDW of the frequency divider circuit 514 in the feedback loop of the PLL circuit 50 or 60.

By way of example, once a change of communication channel is desired, the frequency divider 514 may modify its division ratio by changing the "divider programming word" and may return the bit sequence to the decoder circuit 800. The decoder may thus enable a part of the voltage ladder through the switches $S_{V1}, \ldots, S_{VN}$ so that the varactor(s) $C_V$ and the filter capacitance $C_F$ may be pre-loaded at a value close to the final value of the control voltage. Once the varactor(s) and the filter capacitance are pre-loaded, the PLL loop may be closed and the varactor(s) may perform a "fine tuning" by compensating the residual frequency difference between signals $f_{ref}$ and $f_O$.

Therefore, in one or more embodiments the filter capacitor $C_F$ and the varactor(s) $C_V$ may be connected to one of the voltage levels generated by a resistive string which corresponds to the conversion of the most significant bits (MSB) of the divider programming word.

It is noted that the inductive component and the capacitive component in the LC resonant circuit 518 may be arranged according to various other arrangements (compare, for instance, the different arrangements exemplified in FIGS. 2, 5 and 6), without departing from the scope of this disclosure. For instance, one or more embodiments may comprise one of a Hartley oscillator, a Colpitts oscillator or a Clapp oscillator.

It is noted that, while being suitable for performing a calibration phase during the dead times between chirp signals, one or more embodiments may involve performing the calibration phase (also) at the start-up of the PLL circuit.

Figure 9:
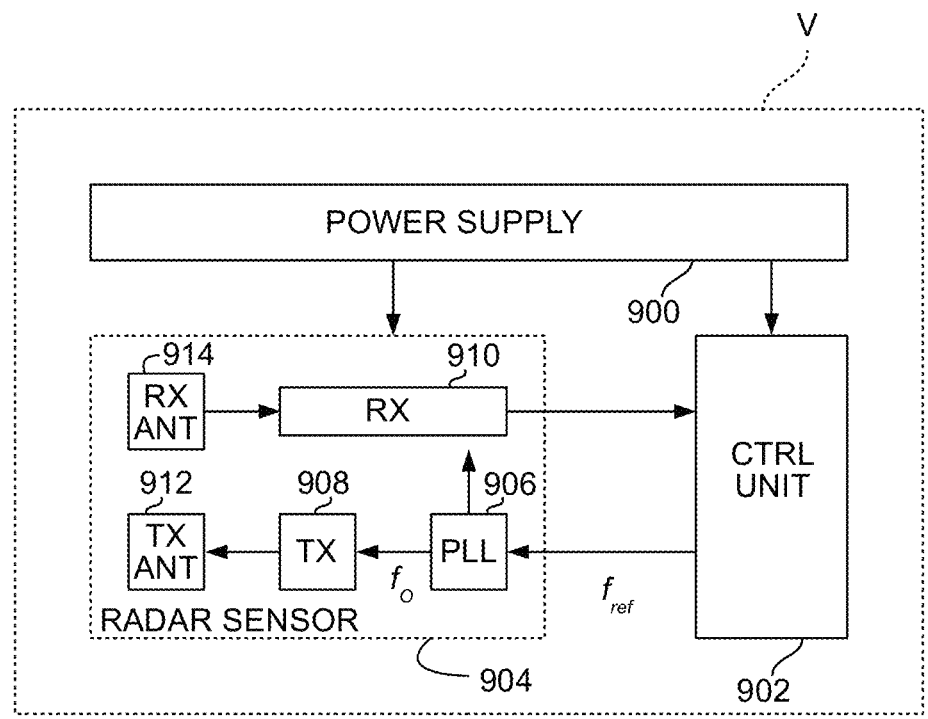
FIG. 9 is a circuit block diagram exemplary of a radar architecture in a vehicle according to one or more embodiments of the present description.

As exemplified in FIG. 9, one or more embodiments may be applied in a vehicle V. The vehicle V may comprise a power supply system 900, a control unit 902 (e.g., a microcontroller unit, MCU) and a radar sensor 904.

The radar sensor 904 may comprise a PLL circuit 906, a transmitter circuit 908, a receiver circuit 910, transmitter antenna 912 and a receiver antenna 914.

The power supply system 900 may provide a supply voltage (e.g., equal to 1 V or 3.3 V) to the radar sensor 904 and a supply voltage (e.g., equal to 3.3 V or 5 V) to the control unit 902.

The control unit 902 may provide an input reference signal $f_{ref}$ to control the PLL circuit 906. The PLL circuit 906 may provide a variable-frequency signal $f_O$ to drive the transmitter circuit 908 (e.g., according to a FMCW driving scheme). The transmitter circuit may bias the transmitter antenna 912 accordingly, to emit a transmission signal TX.

The receiver antenna 914 may receive the echo signal RX and provide it to the receiver circuit 910 which processes the information about the transmitted and received signals to provide information about the distance of a target object.

One or more embodiments may thus provide one or more of the following advantages: fast dynamic calibration suitable for use in automotive radar sensors, insofar as one or more embodiments may not require a delay equal to N times the settling time of the PLL circuit; dynamic compensation of temperature variations; fast pre-charge of the filter capacitor $C_F$ (via the switch $S_V$ or switches $S_{V1}, \ldots, S_{VN}$) during the dead times, which may result in a faster response of the PLL circuit; improved accuracy by performing the dynamic calibration during dead times between subsequent chirp signals; fast repositioning at the minimum frequency value $f_{min}$ after sweeping a complete frequency ramp during a chirp signal; and faster data acquisition as a result of the reduction of the dead time duration between subsequent chirp signals.

It is noted that temperature variations may produce a deviation of the PLL output frequency. The calibration technique disclosed herein facilitates compensating process and supply variations, as well as temperature variations, by the insertion of the capacitances of the array of capacitances of the LC resonant circuit. In particular, a calibration technique as disclosed herein may be dynamic, i.e., it may be performed between one chirp and another. By acquiring several hundred chirps for each radar scan, one or more embodiments facilitate a constant compensation of temperature variations, in contrast with conventional systems which do not have this characteristic insofar as they perform the calibration at startup and cannot compensate for variations that occur after and throughout the operating time. In one or more embodiments, the temperature compensation may be accurate insofar as it is performed with the same periodicity as the chirp, e.g., 10-40 µs. Temperature variations taking place within a single chirp period may be negligible.

As exemplified herein, a circuit such as a PLL circuit (e.g., 50, 60) may comprise: a tunable resonant circuit (e.g., 518) having a first node (e.g., 519a) and a second node (e.g., 519b) and comprising an inductance (e.g., L') coupled between said first node and said second node, a variable capacitance (e.g., $C_V$) coupled between said first node and said second node, and a set of capacitances (e.g., 520) selectively coupleable between said first node and said second node; a control node (e.g., 508) coupled to said variable capacitance, the control node configured to receive a control signal (e.g., $V_C$), wherein said tunable resonant circuit is tunable as a function of said control signal; a biasing circuit (e.g., 516) coupled to said tunable resonant circuit and configured to bias the tunable resonant circuit to generate a variable-frequency output signal (e.g., $f_O$) between said first node and said second node; a phase-frequency detector circuit (e.g., 502) sensitive to an input reference signal (e.g., $f_{ref}$) and to said variable-frequency output signal and configured to generate a first digital control signal (e.g., UP) and a second digital control signal (e.g., DOWN) as a function of a timing offset of said variable-frequency output signal with respect to said input reference signal, wherein said first digital control signal asserted is indicative of a first operational state wherein said timing offset has a first sign (e.g., indicative of said variable-frequency output signal being phase delayed with respect to said input reference signal) and said second digital control signal asserted is indicative of a second operational state wherein said timing offset has a second sign, opposite said first sign (e.g., indicative of said input reference signal being phase delayed with respect to said variable-frequency output signal); a charge pump circuit (e.g., 504; 504a) and a filter circuit (e.g., 506) configured to generate said control signal as a function of said first digital control signal and said second digital control signal; a timer circuit (e.g., 54; 64) sensitive to a reset signal (e.g., R) and configured to generate a timing signal (e.g., TS), wherein said timing signal is asserted in response to a pulse sensed in said reset signal and de-asserted after a time interval (e.g., $T_{ck}/2$) from said sensed pulse; and a calibration circuit (e.g., 52; 62) configured to selectively couple between said first node and said second node selected capacitances in said set of capacitances as a function of said second digital control signal in response to said timing signal being asserted.

As exemplified herein, the circuit may be configured to: generate said variable-frequency output signal comprising frequency sweeps separated by dead times (e.g., DT); and generate pulses in said reset signal at the beginning of said dead times.

As exemplified herein, the circuit may comprise a switch (e.g., $S_V$) configured to selectively couple said control node to a reference control voltage (e.g., $V_{C,min}$) in response to said timing signal being asserted.

As exemplified herein, the circuit may comprise: a feedback loop configured to provide said variable-frequency output signal to said phase-frequency detector circuit, wherein the feedback loop comprises a frequency divider circuit (e.g., 514); a voltage divider network (e.g., $V_{DD}$, $R_0, \ldots, R_N$) configured to generate a set of different reference control voltages (e.g., $V_{C1}, \ldots, V_{CN}$); and a set of switches (e.g., $S_{V1}, \ldots, S_{VN}$) configured to selectively couple said control node to a respective reference control voltage in said set of different reference control voltages as a function of a divider programming word (e.g., CDW) of said frequency divider circuit.

As exemplified herein, said calibration circuit may be configured to count a number of pulses occurring in said second digital control signal and to couple between said first node and said second node a capacitance in said set of capacitances in response to a counted number of pulses in said second digital control signal reaching a threshold value.

As exemplified herein, said calibration circuit may comprise a digital counter circuit (e.g., 526) configured to count said number of pulses occurring in said second digital control signal.

As exemplified herein, said calibration circuit may comprise: a further charge pump circuit (e.g., 504b) configured to generate a pulsed current signal (e.g., $I_{CP,A}$) as a function of said first digital control signal and said second digital control signal; an integrator circuit (e.g., $S_C$, $C_C$) configured to generate a signal (e.g., $V_{CP}$) indicative of a value of an integral over time of said pulsed current signal; and a comparator circuit (e.g., 602) configured to compare said signal indicative of a value of an integral over time of said pulsed current signal to a threshold voltage (e.g., $V_{TH}$) to detect said counted number of pulses in said second digital control signal reaching said threshold value.

As exemplified herein, a radar sensor (e.g., 904) may comprise a circuit (e.g., 906) according to one or more embodiments and a transmitter circuit (e.g., 908) coupled to an antenna (e.g., 912). The circuit may be configured to receive said input reference signal from a microcontroller unit (e.g., 902) and provide said variable-frequency output signal to said transmitter circuit.

As exemplified herein, a vehicle (e.g., V) may comprise a radar sensor according to one or more embodiments.

As exemplified herein, a method of operating a circuit according to one or more embodiments may comprise: biasing the tunable resonant circuit to generate a variable-frequency output signal between said first node and said second node; generating a first digital control signal and a second digital control signal as a function of an input reference signal and said variable-frequency output signal, wherein said first digital control signal asserted is indicative of a first operational state wherein said timing offset has a first sign and said second digital control signal asserted is indicative of a second operational state wherein said timing offset has a second sign, opposite said first sign; generating a control signal as a function of said first digital control signal and said second digital control signal; receiving said control signal at said control node coupled to said variable capacitance and tuning said tunable resonant circuit as a function of said control signal; sensing a reset signal and generating a timing signal, wherein said timing signal is asserted in response to a pulse sensed in said reset signal and de-asserted after a time interval from said sensed pulse; and selectively coupling between said first node and said second node selected capacitances in said set of capacitances as a function of said second digital control signal in response to said timing signal being asserted.

Without prejudice to the underlying principles, the details and embodiments may vary, even significantly, with respect to what has been described by way of example only, without departing from the extent of protection.

The extent of protection is determined by the annexed claims.

The invention claimed is:

1. A circuit, comprising:
a tunable resonant circuit comprising:
   a first node;
   a second node;
   an inductance coupled between said first node and said second node;
   a variable capacitance coupled between said first node and said second node;
   a set of capacitances selectively coupleable between said first node and said second node; and
   a control node coupled to said variable capacitance, the control node configured to receive a control signal, wherein said tunable resonant circuit is tunable as a function of said control signal;
a biasing circuit coupled to said tunable resonant circuit and configured to bias the tunable resonant circuit to generate a variable-frequency output signal between said first node and said second node;
a phase-frequency detector circuit sensitive to an input reference signal and to said variable-frequency output signal, and configured to generate a first digital control signal and a second digital control signal as a function of a timing offset of said variable-frequency output signal with respect to said input reference signal, wherein assertion of said first digital control signal is indicative of a first operational state where said timing offset has a first sign, and wherein assertion of said second digital control signal is indicative of a second operational state where said timing offset has a second sign opposite said first sign;
a charge pump circuit and a filter circuit configured to generate said control signal to the control node as a function of said first digital control signal and said second digital control signal;
a timer circuit sensitive to a reset signal and configured to generate a timing signal, wherein said timing signal is asserted in response to a pulse sensed in said reset signal and said timing signal is de-asserted after a time interval from said sensed pulse; and
a calibration circuit configured to selectively couple, between said first node and said second node, selected capacitances from said set of capacitances, said selected capacitances being selected as a function of said second digital control signal, said calibration circuit performing the selective coupling in response to said timing signal being asserted.

2. The circuit of claim 1, wherein said biasing circuit is configured to generate said variable-frequency output signal comprising frequency sweeps separated by dead times, and generate pulses in said reset signal at a beginning of said dead times.

3. The circuit of claim 1, further comprising a switch configured to selectively couple said control node to a reference control voltage in response to said timing signal being asserted.

4. The circuit of claim 1, comprising:
a feedback loop configured to provide said variable-frequency output signal to said phase-frequency detector circuit, wherein the feedback loop comprises a frequency divider circuit;
a voltage divider network configured to generate a set of different reference control voltages; and
a set of switches configured to selectively couple said control node to a respective reference control voltage in said set of different reference control voltages as a function of a divider programming word of said frequency divider circuit.

5. The circuit of claim 1, wherein said calibration circuit is configured to count a number of pulses occurring in said second digital control signal and to couple, between said first node and said second node, a capacitance from said set of capacitances in response to a counted number of pulses in said second digital control signal reaching a threshold value.

6. The circuit of claim 5, wherein said calibration circuit comprises a digital counter circuit configured to count said number of pulses occurring in said second digital control signal.

7. The circuit of claim 5, wherein said calibration circuit comprises:
a further charge pump circuit configured to generate a pulsed current signal as a function of said first digital control signal and said second digital control signal;
an integrator circuit configured to generate a signal indicative of a value of an integral over time of said pulsed current signal; and
a comparator circuit configured to compare said signal indicative of a value of an integral over time of said pulsed current signal to a threshold voltage to detect said counted number of pulses in said second digital control signal reaching said threshold value.

8. A radar sensor, comprising:
a circuit comprising:
   a tunable resonant circuit having a first node and a second node, and comprising:
      an inductance coupled between said first node and said second node;
      a variable capacitance coupled between said first node and said second node;
      a set of capacitances selectively coupleable between said first node and said second node; and
      a control node coupled to said variable capacitance, the control node configured to receive a control signal, wherein said tunable resonant circuit is tunable as a function of said control signal;
   a biasing circuit coupled to said tunable resonant circuit and configured to bias the tunable resonant circuit to generate a variable-frequency output signal between said first node and said second node;
   a phase-frequency detector circuit sensitive to an input reference signal and to said variable-frequency output signal, and configured to generate a first digital control signal and a second digital control signal as a function of a timing offset of said variable-frequency output signal with respect to said input reference signal, wherein assertion of said first digital control signal is indicative of a first operational state where said timing offset has a first sign, and wherein assertion of said second digital control signal is indicative of a second operational state where said timing offset has a second sign opposite said first sign;

a charge pump circuit and a filter circuit configured to generate said control signal to the control node as a function of said first digital control signal and said second digital control signal;

a timer circuit sensitive to a reset signal and configured to generate a timing signal, wherein said timing signal is asserted in response to a pulse sensed in said reset signal and said timing signal is de-asserted after a time interval from said sensed pulse; and a calibration circuit configured to selectively couple, between said first node and said second node, selected capacitances from said set of capacitances, said selected capacitances being selected as a function of said second digital control signal, said calibration circuit performing the selective coupling in response to said timing signal being asserted; and a transmitter circuit coupled to an antenna;

wherein the circuit is further configured to receive said input reference signal from a microcontroller unit and provide said variable-frequency output signal to said transmitter circuit.

9. A vehicle comprising the radar sensor according to claim 8.

10. The radar sensor of claim 8, wherein said biasing circuit is configured to generate said variable-frequency output signal comprising frequency sweeps separated by dead times, and generate pulses in said reset signal at a beginning of said dead times.

11. The radar sensor of claim 8, further comprising a switch configured to selectively couple said control node to a reference control voltage in response to said timing signal being asserted.

12. The radar sensor of claim 8, comprising:
a feedback loop configured to provide said variable-frequency output signal to said phase-frequency detector circuit, wherein the feedback loop comprises a frequency divider circuit;
a voltage divider network configured to generate a set of different reference control voltages; and
a set of switches configured to selectively couple said control node to a respective reference control voltage in said set of different reference control voltages as a function of a divider programming word of said frequency divider circuit.

13. The radar sensor of claim 8, wherein said calibration circuit is configured to count a number of pulses occurring in said second digital control signal and to couple, between said first node and said second node, a capacitance from said set of capacitances in response to a counted number of pulses in said second digital control signal reaching a threshold value.

14. The radar sensor of claim 13, wherein said calibration circuit comprises a digital counter circuit configured to count said number of pulses occurring in said second digital control signal.

15. The radar sensor of claim 13, wherein said calibration circuit comprises:
a further charge pump circuit configured to generate a pulsed current signal as a function of said first digital control signal and said second digital control signal;
an integrator circuit configured to generate a signal indicative of a value of an integral over time of said pulsed current signal; and a comparator circuit configured to compare said signal indicative of a value of an integral over time of said pulsed current signal to a threshold voltage to detect said counted number of pulses in said second digital control signal reaching said threshold value.

16. A method of operating a circuit, the method comprising:
biasing a tunable resonant circuit to generate a variable-frequency output signal between a first node and a second node;
generating a first digital control signal and a second digital control signal as a function of an input reference signal and said variable-frequency output signal, wherein said first digital control signal being asserted is indicative of a first operational state wherein a timing offset of said variable-frequency output signal with respect to said input reference signal has a first sign and wherein said second digital control signal being asserted is indicative of a second operational state wherein said timing offset has a second sign opposite said first sign;
generating a control signal as a function of said first digital control signal and said second digital control signal;
receiving said control signal at a control node coupled to a variable capacitance and tuning said tunable resonant circuit as a function of said control signal,
sensing a reset signal and generating a timing signal, wherein said timing signal is asserted in response to a pulse sensed in said reset signal and de-asserted after a time interval from said sensed pulse; and
selectively coupling, between said first node and said second node, selected capacitances from said set of capacitances as a function of said second digital control signal, in response to said timing signal being asserted.

17. The method of claim 16, wherein said variable-frequency output signal is generated by biasing the tunable resonant circuit to perform frequency sweeps separated by dead times, and generate pulses in said reset signal at a beginning of said dead times.

18. The method of claim 16, further comprising selectively coupling said control node to a reference control voltage in response to said timing signal being asserted.

19. The method of claim 10, further comprising counting a number of pulses occurring in said second digital control signal and coupling, between said first node and said second node, a capacitance from said set of capacitances in response to a counted number of pulses in said second digital control signal reaching a threshold value.

20. The method of claim 19, wherein a calibration circuit comprises a digital counter circuit configured to count said number of pulses occurring in said second digital control signal.

21. The method of claim 20, further comprising:
generating a pulsed current signal as a function of said first digital control signal and said second digital control signal;
generating a signal indicative of a value of an integral over time of said pulsed current signal; and
comparing said signal indicative of a value of an integral over time of said pulsed current signal to a threshold voltage to detect said counted number of pulses in said second digital control signal reaching said threshold value.

* * * * *